United States Patent
Tsang et al.

(10) Patent No.: US 10,433,048 B2
(45) Date of Patent: Oct. 1, 2019

(54) MICRO SPEAKER HAVING A HERMETICALLY SEALED ACOUSTIC CHAMBER WITH INCREASED VOLUME

(71) Applicant: Apple Inc., Cupertino, CA (US)

(72) Inventors: Thomas H. Tsang, San Jose, CA (US); Onur I. Ilkorur, Campbell, CA (US); Derek C. Krass, Santa Cruz, CA (US); Logan A. Rotolo, Ellenville, NY (US); Christopher Wilk, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/693,329

(22) Filed: Aug. 31, 2017

(65) Prior Publication Data

US 2019/0069076 A1      Feb. 28, 2019

(51) Int. Cl.
*H04R 31/00* (2006.01)
*H04R 1/02* (2006.01)
(Continued)

(52) U.S. Cl.
CPC ........... *H04R 1/2811* (2013.01); *H04R 1/025* (2013.01); *H04R 7/12* (2013.01); *H04R 9/025* (2013.01);
(Continued)

(58) Field of Classification Search
CPC ...... H04R 9/06; H04R 2499/11; H04R 9/025; H04R 2400/03; H04R 9/043; H04R 9/066;
(Continued)

(56) References Cited

U.S. PATENT DOCUMENTS

| 6,574,096 B1 | 6/2003 | Difonzo et al. |
| 6,620,371 B1 | 9/2003 | Winget et al. |

(Continued)

FOREIGN PATENT DOCUMENTS

| CN | 104735594 A | 6/2015 |
| CN | 205017579 U | 2/2016 |

(Continued)

OTHER PUBLICATIONS

He, et al., "New solutions for metal/plastic hybrid design via nano-molding technology", Plastics Research Online, Society of Plastics Engineers (SPE), (Jul. 16, 2015), 1-6.
Chinese Evaluation Report for Utility Model (UMPER) dated Jun. 25, 2019 for related Chinese Appln. No. ZL201821334555X 12 Pages.

*Primary Examiner* — Curtis A Kuntz
*Assistant Examiner* — Julie X Dang
(74) *Attorney, Agent, or Firm* — Womble Bond Dickinson (US) LLP

(57) ABSTRACT

A micro speaker assembly including a speaker enclosure having an enclosure wall separating a surrounding environment from an encased space, wherein the enclosure wall defines, in part, an acoustic channel that acoustically couples the encased space to the surrounding environment, and the enclosure wall comprises a chemically etched insert molded metal portion that is mechanically interlocked and hermetically sealed to a plastic portion. The micro speaker further including a speaker assembly positioned within the encased space, the speaker assembly having a sound radiating surface facing the metal portion of the enclosure wall, a voice coil extending from the sound radiating surface, a magnet assembly having a magnetic gap aligned with the voice coil, and an acoustic chamber formed, in part, by the metal portion of the enclosure wall and the sound radiating surface.

20 Claims, 6 Drawing Sheets

(51) Int. Cl.
- *H04R 1/28* (2006.01)
- *H04R 7/12* (2006.01)
- *H04R 9/02* (2006.01)
- *H04R 9/06* (2006.01)
- *H05K 5/00* (2006.01)

(52) U.S. Cl.
CPC ......... *H04R 31/006* (2013.01); *H05K 5/0095* (2013.01); *H04R 1/021* (2013.01); *H04R 9/06* (2013.01); *H04R 2201/029* (2013.01)

(58) Field of Classification Search
CPC ............ H04R 2400/07; H04R 2499/15; H04R 1/026; H04R 2307/025; H04R 7/18; H04R 17/00; H04R 1/025; H04R 1/2811; H04R 1/44; H04R 2460/13; H04R 31/003; B32B 3/26; B32B 5/022; B32B 5/024; B32B 5/028; B32B 5/24; B32B 5/30; B32B 7/02; B32B 7/12
USPC ....... 381/412, 389, 326, 151, 398, 431, 111, 381/150; 181/141, 144, 161, 164, 168, 181/172, 173
See application file for complete search history.

(56) References Cited

U.S. PATENT DOCUMENTS

| | | |
|---|---|---|
| 6,768,654 B2 | 7/2004 | Arnold et al. |
| 6,996,425 B2 | 2/2006 | Watanabe |
| 7,947,900 B2 | 5/2011 | Cheng et al. |
| 8,367,210 B2 | 2/2013 | Naritomi et al. |
| 8,681,485 B2 | 3/2014 | Du et al. |
| 2005/0149860 A1 | 7/2005 | Murata |
| 2006/0257624 A1 | 11/2006 | Naritomi et al. |
| 2008/0224358 A1 | 9/2008 | Rogers et al. |
| 2009/0190290 A1 | 7/2009 | Lynch et al. |
| 2009/0257175 A1 | 10/2009 | Shi et al. |
| 2009/0260871 A1 | 10/2009 | Weber |
| 2010/0079970 A1* | 4/2010 | Prest ................ B29C 65/645 361/807 |
| 2015/0373441 A1 | 12/2015 | Behles |
| 2016/0165327 A1 | 6/2016 | Crosby |
| 2017/0134848 A1* | 5/2017 | Shao ................ H04R 1/2834 |

FOREIGN PATENT DOCUMENTS

| | | | |
|---|---|---|---|
| CN | 206024095 U | * | 3/2017 |
| CN | 206433148 U | | 8/2017 |
| WO | WO-2004041532 | | 5/2004 |

* cited by examiner

MICRO SPEAKER HAVING A HERMETICALLY SEALED ACOUSTIC CHAMBER WITH INCREASED VOLUME

FIELD

This application relates generally to a speaker having a hermetically sealed acoustic chamber, more specifically, a micro speaker having a chemically etched insert molded metal plate that forms, in combination with a plastic enclosure, a hermetically sealed acoustic chamber having an increased volume. Other embodiments are also described and claimed.

BACKGROUND

In modern consumer electronics, audio capability is playing an increasingly larger role as improvements in digital audio signal processing and audio content delivery continue to happen. In this aspect, there is a wide range of consumer electronics devices that can benefit from improved audio performance. For instance, smart phones include, for example, electro-acoustic transducers such as speakerphone loudspeakers and earpiece receivers that can benefit from improved audio performance. Smart phones, however, do not have sufficient space to house much larger high fidelity sound output devices. This is also true for some portable personal computers such as laptop, notebook, and tablet computers, and, to a lesser extent, desktop personal computers with built-in speakers. Many of these devices use what are commonly referred to as "micro speakers." Micro speakers are a miniaturized version of a loudspeaker, which use a moving coil motor to drive sound output. The moving coil motor may include a diaphragm (or sound radiating surface), voice coil and magnet assembly positioned within a frame. The input of an electrical audio signal to the moving coil motor causes the diaphragm to vibrate and output sound. The sound may be output from the sound output surface of the diaphragm to a sound output port through a front volume chamber that acoustically couples to the sound output face to the output port. A back volume chamber may be formed around the opposite face of the diaphragm to enhance sound output quality. Micro speaker performance is dependent on volume efficiency. Due to increasing demands for relatively low profile devices, particularly in the z-height dimension, however, it is becoming increasingly difficult to maximize an acoustic volume of the front and back volume chambers.

SUMMARY

Speaker performance, and particularly micro speaker performance, is dependent on volume efficiency, where more volume means a better speaker. Volume efficiency may become more constrained when product requirements need water resistance and the ability to keep the seal after reliability tests. Creating a robust seal, however, usually requires volume to be used by the seal structure. This seal volume may, in turn, directly degrade the performance of the micro speaker. In addition, some seal structures may also require extra parts or components (e.g. glue) and processes that complicate assembly and increase cost.

This disclosure is directed to a transducer, for example a moving-coil speaker (e.g., a micro speaker) having an enclosure that is water resistant and improves volume efficiency, mechanical strength, and acoustic robustness of the micro speaker. More specifically, the micro speaker enclosure may have an enclosure wall that is formed by a relatively thin chemically etched metal portion insert molded with a plastic portion. An interlocking region between the metal portion and the plastic portion has a reduced size, which in turn, increases a size of the speaker acoustic volume. To achieve this, the metal portion has an interlocking end and a plurality of nano sized pores formed using a nano molding technology (NMT). These additional features help to reduce the material necessary at the interlock without compromising the mechanical strength, and further allow for a hermetic seal to be formed between the plastic portion and the metal portion in the absence of a sealant such as glue (which can unnecessarily take up volume). The resulting micro speaker has an improved low and midband acoustic performance, reduced high order harmonic distortion and irregularities in the flow path, while also achieving a mechanically strong hermetic seal.

Representatively, in one embodiment, the invention is directed to a speaker including a speaker enclosure having an enclosure wall separating a surrounding environment from an encased space, wherein the enclosure wall defines, in part, an acoustic channel that acoustically couples the encased space to the surrounding environment. The enclosure wall may include a chemically etched insert molded metal portion that is mechanically interlocked and hermetically sealed to a plastic portion. The speaker may further include a speaker assembly positioned within the encased space, the speaker assembly having a sound radiating surface facing the metal portion of the enclosure wall, a voice coil extending from the sound radiating surface, a magnet assembly having a magnetic gap aligned with the voice coil, and an acoustic chamber formed, in part, by the metal portion of the enclosure wall and the sound radiating surface. In some cases, the chemically etched insert molded metal portion is chemically etched to have a plurality of pores, and the plastic portion is embedded within the plurality of pores to mechanically interlock and hermetically seal the metal portion to the plastic portion. In addition, the plurality of pores may include nano sized pores that range in diameter from 30 to 200 nanometers. Still further, the chemically etched insert molded metal portion may include an interlocking end that mechanically interlocks the metal portion to the plastic portion. Still further, the chemically etched insert molded metal portion may be hermetically sealed to the plastic portion in the absence of a chemical adhesive. The acoustic chamber may be a front volume chamber that is acoustically coupled to the surrounding environment by the acoustic channel. In some embodiments, the metal portion may be a metal plate having a thickness that is less than a thickness of the plastic portion such that a volume of the acoustic chamber is increased in comparison to an acoustic chamber formed by only a plastic portion. In addition, a height dimension (or z-height) of the acoustic channel may be greater than a height dimension (or z-height) of an acoustic channel formed, in part, by a non-chemically etched metal portion that is insert molded to a plastic portion.

In another embodiment, the invention is directed to a micro speaker assembly including an enclosure having an enclosure wall separating a surrounding environment from an encased space, wherein the enclosure wall defines, in part, an acoustic channel between the encased space and the surrounding environment, and the enclosure wall comprises a metal plate and a plastic portion, the metal plate having an interlocking end and a plurality of interlocking pores that interlock with the plastic portion and form a hermetic seal between the metal plate and the plastic portion. The assembly may further include a sound radiating surface positioned within the encased space and dividing the encased space into a first acoustic chamber and a second acoustic chamber, and the metal plate may form a portion of the first acoustic chamber. In addition, a voice coil may extend from one side of the sound radiating surface and a magnet assembly having a magnetic gap aligned with the voice coil may also be provided. In some cases, the first acoustic chamber is a front volume chamber formed between one side of the sound radiating surface and the metal plate, and the acoustic channel acoustically couples the front volume chamber to the surrounding environment. The metal plate may include a reduced thickness of 4 millimeters or less such that a volume of the first chamber is increased. The interlocking end may include, for example, an interlock path length of from 0.8 mm to 1.6 mm. In some cases, the plastic portion is insert molded to the interlocking end and the plurality of interlocking pores.

Another embodiment of the invention may include a method of manufacturing a micro speaker assembly including the processing operations of forming a metal plate having a plurality of interlocking pores and an interlocking end, and forming a micro speaker enclosure by insert molding a plastic portion to the interlocking pores and the interlocking end of the metal plate. Forming the metal plate may include using a nano molding technology (NMT) to form the plurality of interlocking pores. In addition, the process may include positioning a sound radiating surface, a voice coil and a magnet assembly within the micro speaker enclosure, and wherein the metal plate forms a portion of a front volume chamber acoustically coupling the sound radiating surface to an acoustic channel of the micro speaker enclosure.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments are illustrated by way of example and not by way of limitation in the figures of the accompanying drawings in which like references indicate similar elements. It should be noted that references to "an" or "one" embodiment in this disclosure are not necessarily to the same embodiment, and they mean at least one.

DETAILED DESCRIPTION

In this section we shall explain several preferred embodiments of this invention with reference to the appended drawings. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known structures and techniques have not been shown in detail so as not to obscure the understanding of this description.

The terminology used herein is for the purpose of describing particular embodiments only and is not intended to be limiting of the invention. Spatially relative terms, such as "beneath", "below", "lower", "above", "upper", and the like may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

As used herein, the singular forms "a", "an", and "the" are intended to include the plural forms as well, unless the context indicates otherwise. It will be further understood that the terms "comprises" and/or "comprising" specify the presence of stated features, steps, operations, elements, and/or components, but do not preclude the presence or addition of one or more other features, steps, operations, elements, components, and/or groups thereof.

The terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps or acts are in some way inherently mutually exclusive.

Figure 1:
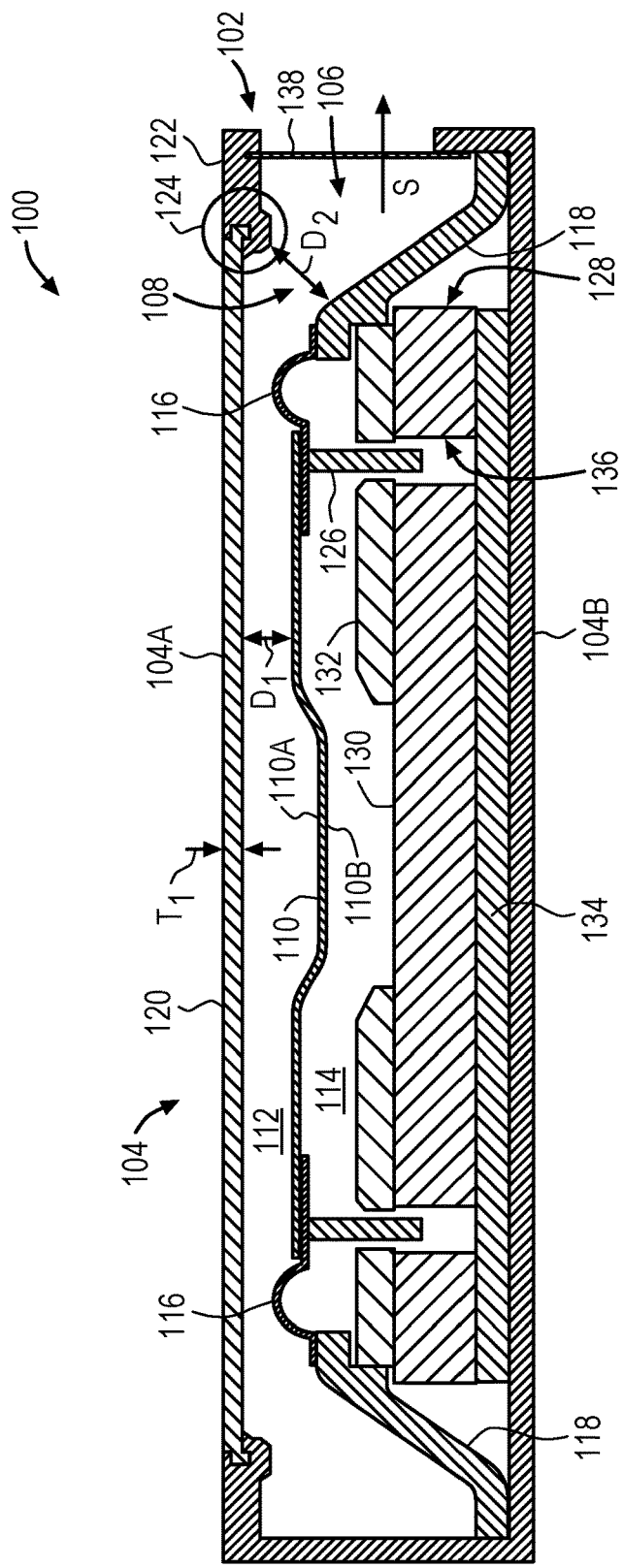
FIG. 1 illustrates a cross-sectional side view of one embodiment of a transducer.

FIG. 1 illustrates a cross-sectional side view of one embodiment of a transducer. Transducer 100 may be, for example, an electro-acoustic transducer that converts electrical signals into audible signals that can be output from a device within which transducer 100 is integrated. For example, transducer 100 may be a micro speaker such as a speakerphone speaker or an earpiece receiver found within a smart phone, or other similar compact electronic device such as a laptop, notebook, tablet computer or portable time piece. Transducer 100 may be enclosed within a housing or enclosure of the device within which it is integrated. In some embodiments, transducer 100 may be a 10 mm to 75 mm driver, or 10 mm to 20 mm driver (as measured along the diameter or longest length dimension), for example, a micro speaker.

Transducer 100 may include an enclosure 102, which is made up of an enclosure wall 104 that separates a surrounding environment from an encased space 106. Each of the components of transducer 100, for example components of a speaker assembly as will be discussed herein, may be positioned within encased space 106 and therefore enclosed within enclosure wall 104. In some embodiments, enclosure wall 104 may include a first wall 104A and a second wall 104B, which form a top and bottom side, respectively, of enclosure 102. In addition, at least one of the first wall 104A or the second wall 104B (alone, in combination, or in combination with another encased transducer component) may form all, or a portion of, an acoustic port or channel 108. The acoustic port or channel 108 may acoustically connect the encased space 106 to the surrounding environment. For example, in the case of a micro speaker, the acoustic port or channel 108 may be a port or elongated channel that is acoustically coupled to a sound radiating component of the transducer and outputs sound (S) produced by transducer 100 to the surrounding environment. In addition, in some embodiments, a protective barrier 138 may be positioned at an end of acoustic port or channel 108 to protect transducer 100 from particle or fluid ingress. In this aspect, sound (S) may travel through protective barrier 138 before reaching the surrounding environment.

In one embodiment, one of the components of transducer 100 (e.g., speaker assembly components) positioned within the encased space 106 may include a sound radiating surface (SRS) 110. The SRS 110 may also be referred to herein as an acoustic radiator, a sound radiator or a diaphragm. SRS 110 may be any type of flexible membrane capable of vibrating in response to an acoustic signal to produce acoustic or sound waves. SRS 110 may include a top face 110A, which generates sound to be output to a user, and a bottom face 110B, which is acoustically isolated from the top face 110A, so that any acoustic or sound waves generated by the bottom face 110E do not interfere with those from the top face 110A. The top face 110A may be considered the "top" face because it faces, or includes a surface substantially parallel to, the top or first enclosure wall 104A. Similarly, the bottom face 110E may be considered a "bottom" face because it faces, or includes a surface substantially parallel to, the bottom or second enclosure wall 104B. SRS 110 may have an out-of-plane region as shown (e.g. for geometric stiffening) or be substantially planar.

SRS 110 may be suspended within enclosure 102 by a suspension member 116, which is connected to a support member 118. Representatively, suspension member 116 may be a flexible membrane connected to a perimeter of SRS 110 along one side, and support member 118 along another side. The support member 118 may, in turn, be connected to, for example, the bottom or second enclosure wall 104B such that it, in combination with the top or first enclosure wall 104A, define the acoustic port or channel 108. The support member 118 may be considered an additional wall, for example an interior wall, of enclosure 102. Support member 118 may be a separate structure that is attached to, for example an interior surface of second enclosure wall 104B, or a structure that is integrally formed with enclosure wall 104.

As illustrated in FIG. 1, SRS 110, in combination with support member 118, may divide the encased space 106 into a first acoustic chamber 112 and a second acoustic chamber 114. For example, the first acoustic chamber 112 may acoustically connect the top face 110A of SRS 110 to acoustic port or channel 108, and therefore be considered a front volume chamber. In other words, the first acoustic chamber 112 (or front volume chamber) is between, and formed in part by, the top face 110A of the SRS 110, support member 118 and first enclosure wall 104A. The second acoustic chamber 114 may be acoustically coupled to the bottom face 110E and therefore be considered a back volume chamber. The second acoustic chamber 114 is therefore between the bottom face 110E of SRS 110 and second enclosure wall 104B.

As previously discussed, transducer performance is dependent on volume efficiency and more volume means a better speaker. In addition, it is desirable for enclosure wall 104 to create a water tight seal around the speaker components therein, but without including additional components, materials or the like which could reduce volume. Therefore, in one embodiment, the portion, or portions, of enclosure wall 104 that form first acoustic chamber 112, second acoustic chamber 114, and/or acoustic channel 108, may be thinner than a typical speaker enclosure wall, and hermetically sealed using a nano molding process which eliminates the need for additional materials (e.g., glue) which could take up acoustic volume. For example, in one embodiment, the first enclosure wall 104A of enclosure 102, may include a combination of a metal portion 120 interlocked with a plastic portion 122, with the metal portion 120 being thinner than the plastic portion 122. For example, the metal portion 120 may be a metal plate having a thickness $(T_1)$ that is less than that which can be achieved by injection molding a plastic portion into a plate or sheet (e.g., an enclosure wall). For example, a thickness $(T_1)$ of metal portion 120 may be 0.4 millimeters (mm) or less, for example, 0.3 mm or less, or 0.2 mm. This relatively thin metal portion 120 may be positioned over (or axially aligned with) SRS 110, such that the first acoustic chamber 112 surrounding the top side 110A of the SRS 110 (e.g., the front volume chamber) is maximized, or otherwise increased (e.g., increased in a z-height dimension $(D_1)$), to increase the volume to more than what would occur if the metal portion 120 were omitted and only a plastic portion 122 were used to form first acoustic chamber 112. In addition, it should be understood that although in the illustrated embodiment, metal portion 120 is shown forming part of first acoustic chamber 112, which is considered the front volume chamber, metal portion 120 may be part of any portion of the enclosure wall that forms an acoustic chamber, and therefore increase an acoustic volume of the corresponding chamber. For example, metal portion 120 may be part of an enclosure wall that forms second acoustic chamber 114 (e.g., the second, or bottom, enclosure wall 104B), and may therefore increase a volume of the speaker back volume chamber.

In addition, to further maximize a volume or size of first acoustic chamber 112, second acoustic chamber 114, and/or acoustic channel 108, the size of the interlocking region 124 between metal portion 120 and plastic portion 122 is reduced. For example, interlocking region 124 may have a relatively low profile (e.g. in an axial or z-height direction), for example, a size that is 75 percent smaller than a traditional enclosure wall made up of two or more pieces or a single piece of plastic. This in turn, results in the acoustic volume, port or channel, formed in part by the interlocking region 124, being increased. For example, as a result of the reduced size of interlocking region 124, a dimension $(D_2)$ of acoustic channel 108 may be increased by 20 percent. Dimension $(D_2)$ corresponds to a size of the gap or space between interlocking region 124 and support member 118 and may be referred to herein as a z-opening, z-height or height dimension of acoustic port or channel 108. In addition, it should be understand that the 20 percent increase in dimension $(D_2)$ of acoustic port or channel 108 is in comparison to, for example, an enclosure wall having multiple pieces attached together without using a chemically etched metal portion insert molded to a plastic portion and having the interlocking features disclosed herein.

To accomplish this reduction in size, metal portion 120 may be manufactured or created to have an interlocking end and processed using a nano molding technique to embed (or mold) metal portion 120 within plastic portion 122. The nano molding technique creates interlocking pores within metal portion 120, which in addition to the interlocking end, increase an interlock strength between metal portion 120 and plastic portion 122 without requiring additional metal or plastic material at the interlocking region 124. In addition, the interlocking pores allow for a hermetic (or water tight) seal between metal portion 120 and plastic portion 122 in the absence of additional components or materials (e.g., glue) at potential points of leakage. This seal prevents acoustic cancellation and water ingress beyond (e.g., below) SRS 110 and therefore prevents any water, which may unintentionally enter transducer 100, from damaging the various electronic components and circuitry associated with transducer 100 (e.g., voice coil 126). In this aspect, transducer 100 has some tolerance to water and/or may be considered water resistant in that water will not disable the transducer 100. Further details regarding the interlocking end, interlocking pores and processing techniques will be discussed in reference to FIG. 2-FIG. 4.

Returning now to the interior components of transducer 100, transducer 100 may also include a voice coil 126 positioned along a bottom face 110E of SRS 110 (e.g., a face of SRS 110 facing magnet assembly 128). For example, in one embodiment, voice coil 126 includes an upper end directly attached to the bottom face 110E of SRS 110, such as by chemical bonding or the like, and a lower end. In another embodiment, voice coil 126 may be formed by a wire wrapped around a former or bobbin and the former or bobbin is directly attached to the bottom face 110E of SRS 110. In one embodiment, voice coil 126 may have a similar profile and shape to that of SRS 110. For example, where SRS 110 has a square, rectangular, circular or racetrack shape, voice coil 126 may also have a similar shape. For example, voice coil 126 may have a substantially rectangular, square, circular or racetrack shape.

Transducer 100 may further include a magnet assembly 128. Magnet assembly 128 may include a magnet 130 (e.g., a NdFeB magnet), with a top plate 132 and a yoke 134 for guiding a magnetic circuit generated by magnet 130. Magnet assembly 128, including magnet 130, top plate 132 and yoke 134, may be positioned such that voice coil 126 is aligned with magnetic gap 136 formed by magnet 130. For example, magnet assembly 128 may be below SRS 110, and in some cases, between SRS 110 and the bottom, or second enclosure wall 104B. In addition, in some embodiments, top plate 132 may be specially designed to accommodate an out-of-plane region (e.g., a concave or dome shaped region) of SRS 110. For example, top plate 132 may have a cut-out or opening within its center that is aligned with the out-of-plane region of SRS 110. In this aspect, the additional space created below the out-of-plane region of SRS 110 allows SRS 110 to move or vibrate up and down (e.g., pistonically) without contacting top plate 132. In this aspect, the opening may have a similar size or area as the out-of-plane region. In addition, although a one-magnet embodiment is shown here, although multi-magnet motors are also contemplated.

In addition, although not shown, transducer 100 may include circuitry (e.g., an application-specific integrated circuit (ASIC)) or other external components electrically connected to transducer 100 to, for example, drive current through the voice coil 126 to operate the transducer 100.

Figure 2:
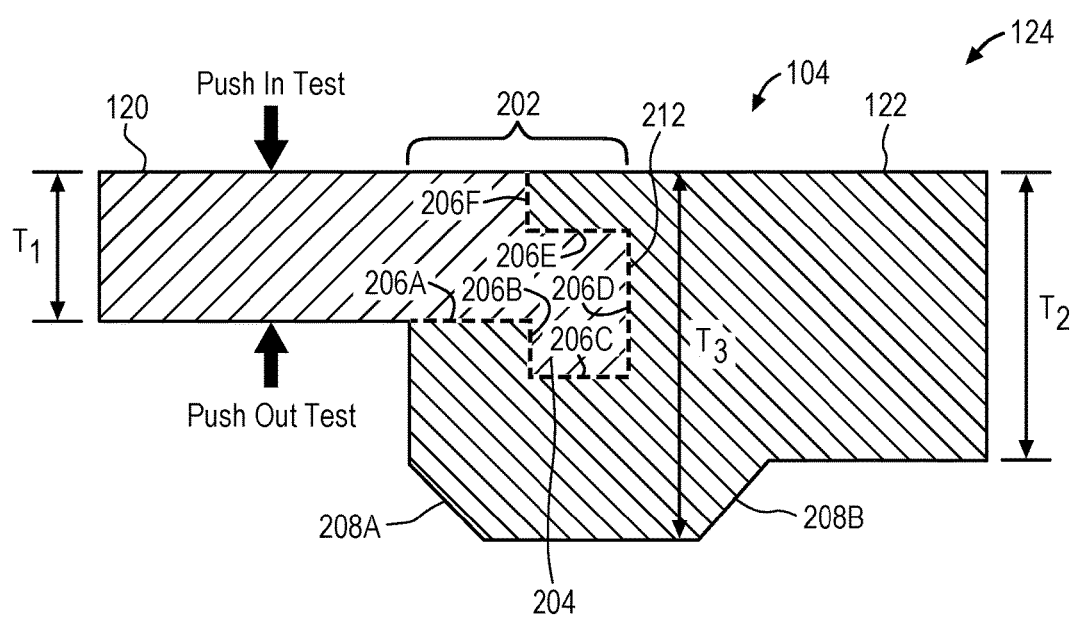
FIG. 2 illustrates a cross-sectional magnified view of an interlocking region of the transducer of FIG. 1.

FIG. 2 illustrates a cross-sectional magnified view of the interlocking region of FIG. 1. From this view, the details of metal portion 120 and plastic portion 122 at the interlocking region 124 can be more clearly seen. In particular, metal portion 120 is shown having a thickness ($T_1$) that is less than the thickness ($T_2$) of plastic portion 122. In addition, metal portion 120 includes interlocking end 202 that is entirely embedded (e.g., molded) within plastic portion 122. Interlocking end 202 may have any a size, shape, and/or dimension that maximizes its interlocking surface area and, in turn, a surface area in contact with plastic portion 122. Representatively, in one embodiment, interlocking end 202 may have a surface area sufficient to survive mechanical push in/out test forces at least two times higher than a non-NMT insert molded metal portion with the same interlock geometry. Representatively, in one embodiment, interlocking end 202 may have a surface area of, for example, 50 mm² or more. Said another way, interlocking end 202 may have an interlock path length 212 that is greater than a thickness ($T_1$) of metal portion 120. For example, in one embodiment, the metal portion 120 could have an interlock path length 212 at least as long as 4 times the thickness ($T_1$) of metal portion 120. For example, metal portion could have a thickness ($T_1$) of approximately 0.2 mm and the interlock path length 212 could be approximately 0.8 mm. It is contemplated, however, that in other embodiments where the metal portion 120 is much thinner, for example approximately 1 mm, the path length could be less than 4 times the thickness. Representatively, in one embodiment, the interlock path length 212 may be from 0.8 mm to 1.6 mm. In FIG. 2, the interlock path length 212 is illustrated as a length of the dashed line 212 defining the interface between metal portion 120 and plastic portion 122, as measured along the cross-section. It should, however, be understood that the interface between metal portion 120 and plastic portion 122 is three-dimensional, therefore the interlock path length may be measured in any direction along the x, y and/or z axes.

In addition, in some embodiments, to achieve the desired surface area and/or interlock path length, interlocking end 202 has an out-of-plane region 204, which increases the number of sides of the interlocking end 202, in comparison to a planar end, and therefore a surface area and/or interlock path length. Out-of-plane region 204 is considered "out-of-plane" in that it includes at least one side that extends outside a plane of metal portion 120, such that it is not planar with the rest of metal portion 120. Representatively, in this embodiment, interlocking end 202 includes a number of sides 206A, 206B, 206C, 206D, 206E and 206F, and at least one of the sides, for example side 206B, extends below a plane of the rest of metal portion 120. In the illustrated embodiment, side 206B is shown extending out-of-plane in a direction of the sound radiating surface 110. In other embodiments, however, the out-of-plane region 204 may have a side that extends out-of-plane in an upward direction, and away from the sound radiating surface 110. In addition, out-of-plane region 204 may have a shape with at least one right angle, as shown. For example, the planar side 206A is at a right angle with respect to the out-of-plane side 206B, side 206B is at a right angle with respect to side 206C, side 206C is at a right angle with respect to side 206D, side 206D is at a right angle with respect to side 206E, and side 206E is at a right angle with respect to side 206F. Other configurations and/or shapes of interlocking end 202, which are defined by one or more right angles, are also contemplated.

Figure 3:
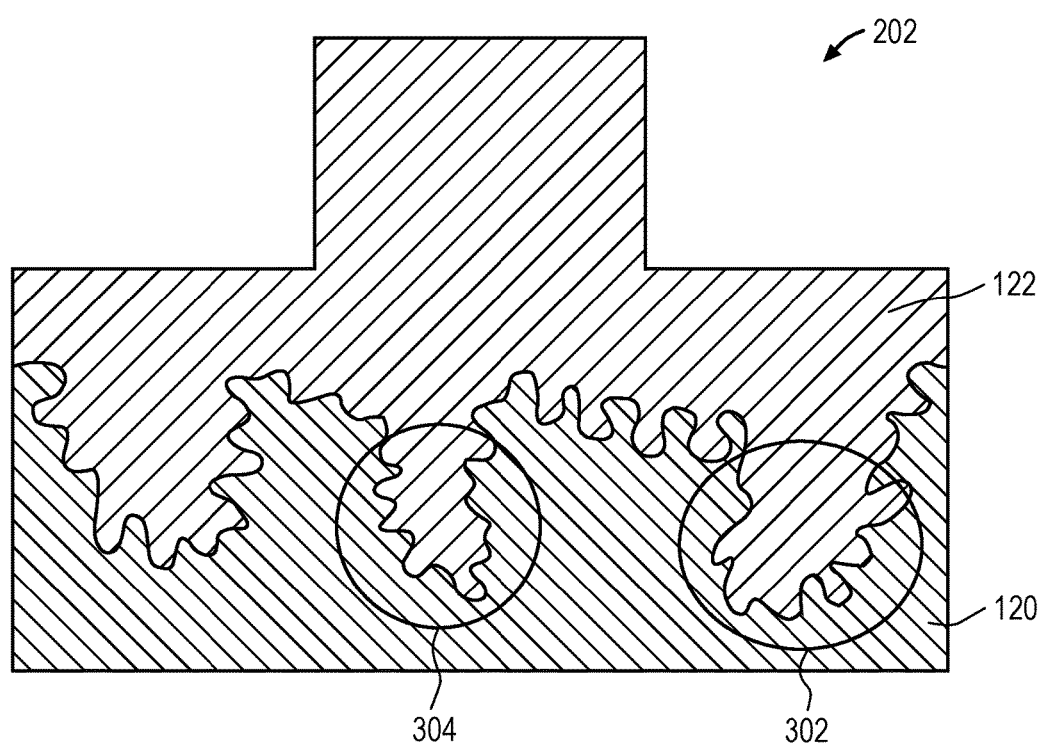
FIG. 3 illustrates a cross-sectional magnified view of the interlocking region of FIG. 2.

As previously discussed, in addition to the geometry of the interlocking end 202, metal portion 120 may include a plurality of interlocking pores, which mechanically strengthen the interlocking region 124 and allow for metal portion 120 to be hermetically sealed to plastic portion 122, in the absence of an additional part or material. FIG. 3 illustrates a magnified view of the interlocking pores formed in the surface of interlocking end. Representatively, interlocking end 202 may include a plurality of "coral reef" like pores 302, 304 within metal portion 120 that the plastic portion 120 flows into during the molding process. Pores 302, 304 may be formed within any one or more of the sides 206A-206F (see FIG. 2) of metal portion 120. The pores 302, 304 may be nano sized pores that have a diameter within a range of from about 10 nm to about 500 nm, for example, from about 30 nm to about 300 nm, or from about 50 nm to about 200. The pores 302, 304 may have different sizes, with the smaller pores contributing to the hermetic seal while the larger pores provide mechanical strength. Because the pores 302, 304 allow for a hermetic seal to be formed between metal portion 120 and plastic portion 122 during the molding process, an additional sealant, such as a sealing glue, which takes up space and may therefore reduce volume efficiency, is eliminated.

In addition, it is noted that since the invention relies on the interlocking geometry of the metal portion 120 and plastic portion 122 for improved strength at the interlocking region 124, the amount of material at the interlocking region 124 can also be reduced. This, in turn, reduces the size at the interlocking region 124, which further results in an increase in the size of the acoustic port or channel 108 and the associated acoustic chamber (e.g., first acoustic chamber 112). For example, the thickness of the material forming plastic portion 122 around interlocking end 202 may be similar to, or only slightly thicker than, a thickness of metal portion 120 of interlocking end 202 itself. Said another way, an overall thickness of the interlocking end 202 (e.g., plastic portion 122 surrounding metal portion 120) as illustrated by thickness ($T_3$), may be only slightly thicker than the thickness ($T_2$) of plastic portion 122 alone. For example, the added (or additional) thickness of thickness ($T_3$) may be less than half the thickness ($T_2$) of plastic portion 122. In other words, thickness ($T_3$) may be 1.5 times or less that of thickness ($T_2$). In addition, in some embodiments, plastic portion 122 may include chamfered corners 208A and 208B surrounding interlocking end 202 to further reduce the thickness ($T_3$). For example, chamfered corners 208A and 208B may be formed in the portions of plastic portion 122 that define (or form walls of) acoustic port or channel 108 and/or first acoustic chamber 112.

It should further be understood that the combination of interlocking pores 302, 304, and interlocking end 202 results in a hermetically sealed interlocking region 124 that can survive push in and push out mechanical strength tests using forces at least two times higher than a non-NMT insert molded metal with the same interlock geometry. The configuration disclosed herein therefore results in an interlocked metal/plastic enclosure with a reduced interlock size that increases volume efficiency while still having at least 5 times the bond strength. Some of the resulting direct acoustic benefits of this configuration may include, but are not limited to, a speaker having a front port or channel that is increased by 20 percent which directly improves midband sensitivity of the speaker performance and decreased high order harmonic distortion (HOHD) by reducing irregularities in the flow path of the acoustic port; eliminates a sealing glue, which in turn, increases the front volume chamber and leaves more space of diaphragm excursion which results in less rub and buzz; increased airflow communication all around the speaker assembly, which in turn helps to cool down the speaker and reduce overheating; and an increase in module resonance frequency and low band sensitivity.

Figure 4:
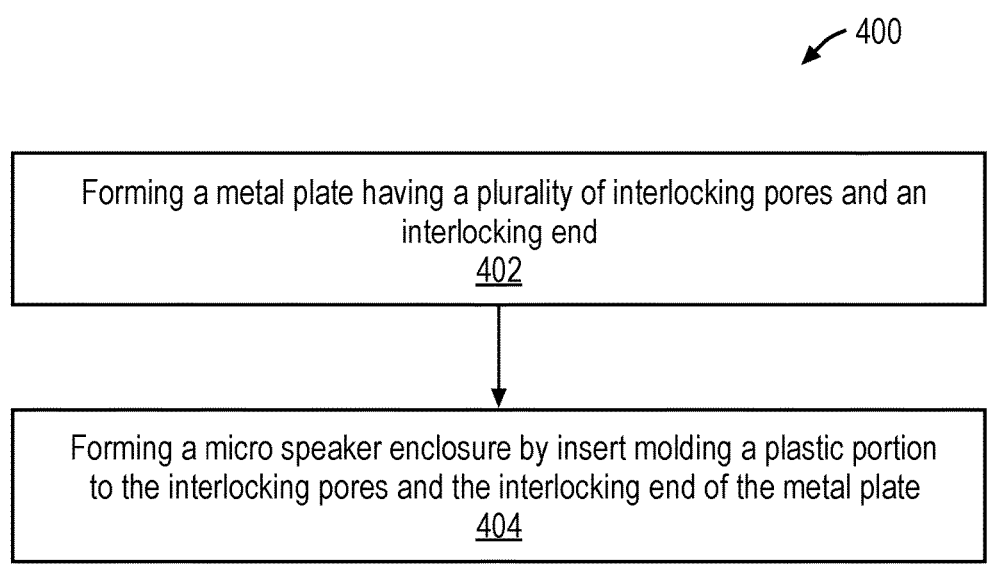
FIG. 4 illustrates a process flow of one embodiment for forming the suspension of FIG. 1.

FIG. 4 illustrates a process flow of one embodiment of a process for manufacturing a transducer having a hermetically sealed enclosure with an increased volume chamber using insert molding and nano molding technology (NMT), as disclosed herein. Representatively, in one embodiment, manufacturing process 400 includes the operation of forming a metal plate having a plurality of interlocking pores and an interlocking end (block 402). The interlocking pores may be formed by chemically treating (e.g., etching) the surface of the metal plate using a nano molding technology (NMT), which results in the formation of a plurality of pores having different sizes within a surface of the metal plate. For example, the surface of the metal plate may be treated using multiple chemical baths. The interlocking end may be formed using a metal stamping tool which can remove desired portions of the metal plate to achieve the desired geometry, for example, an out-of-plane shape with surface area and/or interlocking path length, as previously discussed. In some embodiments, the metal plate is made of steel, aluminum, or brass. In addition, in some embodiments, the metal plate is plated with nickel or anodized for corrosion prevention. Once the metal plate is formed, a micro speaker enclosure is formed by insert molding a plastic portion to the interlocking pores and the interlocking end of the metal plate (block 404). For example, in one embodiment, the formed metal plate may be placed within a mold cavity, and then a melted plastic material is injected into the cavity so that it flows into the interlocking pores and around the interlocking end. The plastic material is then solidified resulting in an insert molded metal plate within a plastic portion of the enclosure, as previously discussed. In addition, in some embodiments, process 400 may include the further processing operation of positioning a sound radiating surface, a voice coil and a magnet assembly within the micro speaker enclosure, to complete the transducer. The metal plate may form a portion of a front volume chamber acoustically coupling the sound radiating surface to an acoustic channel of the micro speaker enclosure.

Figure 5:
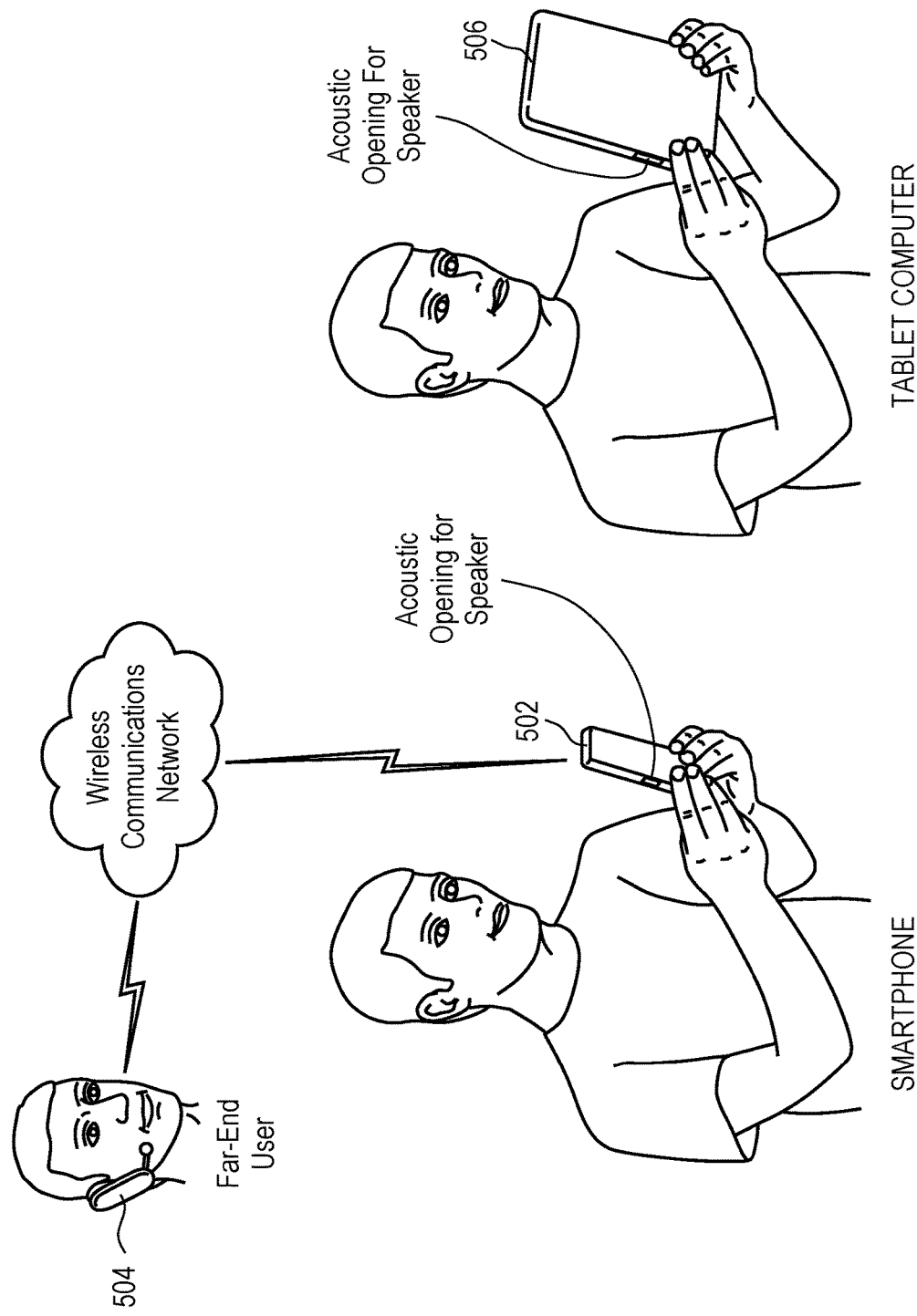
FIG. 5 illustrates one embodiment of a simplified schematic view of one embodiment of an electronic device in which one or more embodiments may be may be implemented.

FIG. 5 illustrates one embodiment of a simplified schematic view of one embodiment of an electronic device in which a transducer (e.g., a micro speaker), such as that described herein, may be implemented. As seen in FIG. 5, the transducer may be integrated within a consumer electronic device 502 such as a smart phone with which a user can conduct a call with a far-end user of a communications device 504 over a wireless communications network; in another example, the speaker may be integrated within the housing of a tablet computer 506. These are just two examples of where the speaker described herein may be used, it is contemplated, however, that the speaker may be used with any type of electronic device in which a transducer, for example, a loudspeaker or microphone, is desired, for example, a tablet computer, a desk top computing device or other display device. In addition, it should be recognized that regardless of the type of electronic device, hermetically sealing the transducer as previously discussed and then implementing it into the device, acoustic ports can be included on the outside of a water resistant product without compromising performance when the product is submerged in the water.

Figure 6:
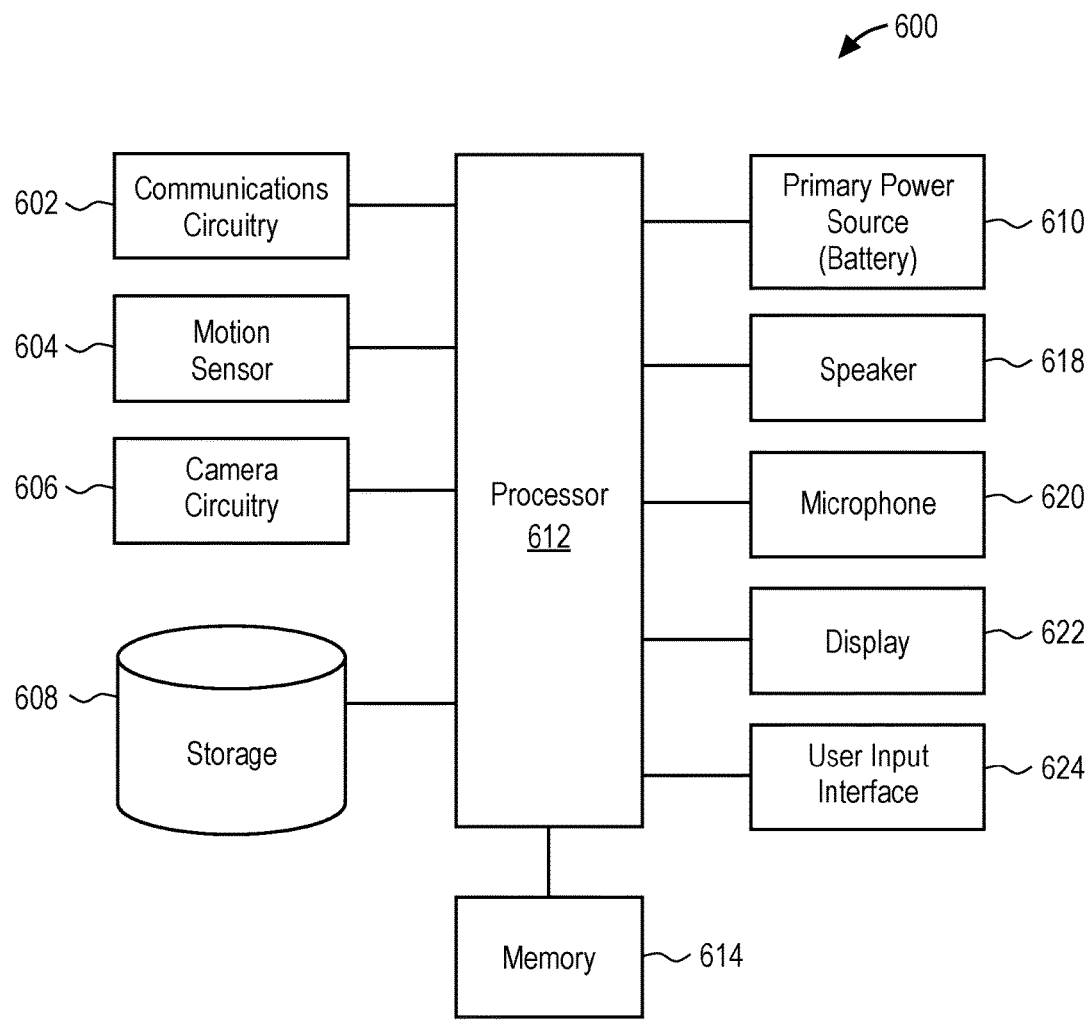
FIG. 6 illustrates a block diagram of some of the constituent components of an embodiment of an electronic device in which one or more embodiments may be implemented.

FIG. 6 illustrates a block diagram of some of the constituent components of an embodiment of an electronic device in which one or more embodiments may be implemented. Device 600 may be any one of several different types of consumer electronic devices. For example, the device 600 may be any transducer-equipped mobile device, such as a cellular phone, a smart phone, a media player, or a tablet-like portable computer.

In this aspect, electronic device 600 includes a processor 612 that interacts with camera circuitry 606, motion sensor 604, storage 608, memory 614, display 622, and user input interface 624. Main processor 612 may also interact with communications circuitry 602, primary power source 610, speaker 618 and microphone 620. Speaker 618 may be a micro speaker such as that described in reference to FIG. 1. The various components of the electronic device 600 may be digitally interconnected and used or managed by a software stack being executed by the processor 612. Many of the components shown or described here may be implemented as one or more dedicated hardware units and/or a programmed processor (software being executed by a processor, e.g., the processor 612).

The processor 612 controls the overall operation of the device 600 by performing some or all of the operations of one or more applications or operating system programs implemented on the device 600, by executing instructions for it (software code and data) that may be found in the storage 608. The processor 612 may, for example, drive the display 622 and receive user inputs through the user input interface 624 (which may be integrated with the display 622 as part of a single, touch sensitive display panel). In addition, processor 612 may send an audio signal to speaker 618 to facilitate operation of speaker 618.

Storage 608 provides a relatively large amount of "permanent" data storage, using nonvolatile solid state memory (e.g., flash storage) and/or a kinetic nonvolatile storage device (e.g., rotating magnetic disk drive). Storage 608 may include both local storage and storage space on a remote server. Storage 608 may store data as well as software components that control and manage, at a higher level, the different functions of the device 600.

In addition to storage 608, there may be memory 614, also referred to as main memory or program memory, which provides relatively fast access to stored code and data that is being executed by the processor 612. Memory 614 may include solid state random access memory (RAM), e.g., static RAM or dynamic RAM. There may be one or more processors, e.g., processor 612, that run or execute various software programs, modules, or sets of instructions (e.g., applications) that, while stored permanently in the storage 608, have been transferred to the memory 614 for execution, to perform the various functions described above.

The device 600 may include communications circuitry 602. Communications circuitry 602 may include components used for wired or wireless communications, such as two-way conversations and data transfers. For example, communications circuitry 602 may include RF communications circuitry that is coupled to an antenna, so that the user of the device 600 can place or receive a call through a wireless communications network. The RF communications circuitry may include a RF transceiver and a cellular baseband processor to enable the call through a cellular network. For example, communications circuitry 602 may include Wi-Fi communications circuitry so that the user of the device 600 may place or initiate a call using voice over Internet Protocol (VOIP) connection, transfer data through a wireless local area network.

The device may include a microphone 620. Microphone 620 may be an acoustic-to-electric transducer or sensor that converts sound in air into an electrical signal. The microphone circuitry may be electrically connected to processor 612 and power source 610 to facilitate the microphone operation (e.g., tilting).

The device 600 may include a motion sensor 604, also referred to as an inertial sensor, that may be used to detect movement of the device 600. The motion sensor 604 may include a position, orientation, or movement (POM) sensor, such as an accelerometer, a gyroscope, a light sensor, an infrared (IR) sensor, a proximity sensor, a capacitive proximity sensor, an acoustic sensor, a sonic or sonar sensor, a radar sensor, an image sensor, a video sensor, a global positioning (GPS) detector, an RF or acoustic doppler detector, a compass, a magnetometer, or other like sensor. For example, the motion sensor 604 may be a light sensor that detects movement or absence of movement of the device 600, by detecting the intensity of ambient light or a sudden change in the intensity of ambient light. The motion sensor 604 generates a signal based on at least one of a position, orientation, and movement of the device 600. The signal may include the character of the motion, such as acceleration, velocity, direction, directional change, duration, amplitude, frequency, or any other characterization of movement. The processor 612 receives the sensor signal and controls one or more operations of the device 600 based in part on the sensor signal.

The device 600 also includes camera circuitry 606 that implements the digital camera functionality of the device 600. One or more solid state image sensors are built into the device 600, and each may be located at a focal plane of an optical system that includes a respective lens. An optical image of a scene within the camera's field of view is formed on the image sensor, and the sensor responds by capturing the scene in the form of a digital image or picture consisting of pixels that may then be stored in storage 608. The camera circuitry 606 may also be used to capture video images of a scene.

Device 600 also includes primary power source 610, such as a built in battery, as a primary power supply.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, the various speaker components described herein could be used in an acoustic-to-electric transducer or other sensor that converts sound in air into an electrical signal, such as for example, a microphone. The description is thus to be regarded as illustrative instead of limiting.

What is claimed is:

1. A speaker comprising:
   a speaker enclosure having an enclosure wall separating a surrounding environment from an encased space, wherein the enclosure wall defines, in part, an acoustic channel that acoustically couples the encased space to the surrounding environment, and the enclosure wall comprises a chemically etched insert molded metal portion that is mechanically interlocked and hermetically sealed to a plastic portion, the chemically etched insert molded metal portion having an interlocking end comprising a planar side that is planar to the metal portion and an out-of-plane side that is outside of the plane of the metal portion and at a right angle to the planar side, and the planar side and the out-of-plane side are entirely embedded within the plastic portion; and
   a speaker assembly positioned within the encased space, the speaker assembly having a sound radiating surface facing the chemically etched insert molded metal portion of the enclosure wall, a voice coil extending from the sound radiating surface, a magnet assembly having a magnetic gap aligned with the voice coil, and an acoustic chamber formed, in part, by the chemically etched insert molded metal portion of the enclosure wall and the sound radiating surface.

2. The speaker of claim 1 wherein the chemically etched insert molded metal portion is chemically etched to have a plurality of pores of a first size and a second size smaller than the first size, and the plastic portion is embedded within the plurality of pores of the first size to mechanically interlock the metal portion to the plastic portion and the plastic portion is embedded within the plurality of pores of the second size to hermetically seal the chemically etched insert molded metal portion to the plastic portion.

3. The speaker of claim 2 wherein the plurality of pores comprise nano sized pores that range in diameter from 30 nanometers to 200 nanometers.

4. The speaker of claim 1 wherein the interlocking end mechanically interlocks the chemically etched insert molded metal portion to the plastic portion.

5. The speaker of claim 1 wherein the interlocking end comprises an interlock path length that is greater than a thickness of the chemically etched insert molded metal portion.

6. The speaker of claim 1 wherein the interlocking end comprises a surface area sufficient to survive a mechanical push in or push out test of the chemically etched insert molded metal portion at forces at least two times higher than a non-chemically etched insert molded metal portion.

7. The speaker of claim 1 wherein the interlocking end comprises a shape in which all sides form right angles with one another.

8. The speaker of claim 1 wherein the chemically etched insert molded metal portion is hermetically sealed to the plastic portion in the absence of a chemical adhesive.

9. The speaker of claim 1 wherein the acoustic chamber is a front volume chamber that is acoustically coupled to the surrounding environment by the acoustic channel.

10. The speaker of claim 1 wherein the chemically etched insert molded metal portion is a metal plate having a thickness that is less than a thickness of the plastic portion such that a volume of the acoustic chamber is increased in comparison to an acoustic chamber formed by only a plastic portion.

11. The speaker of claim 1 wherein a height dimension of the acoustic channel is greater than a height dimension of an acoustic channel formed, in part, by a non-chemically etched metal portion that is insert molded to a plastic portion.

12. A micro speaker assembly comprising:
an enclosure having an enclosure wall separating a surrounding environment from an encased space, wherein the enclosure wall defines, in part, an acoustic channel between the encased space and the surrounding environment, and the enclosure wall comprises a metal plate and a plastic portion, the metal plate having an interlocking end and a plurality of interlocking pores that interlock with the plastic portion and form a hermetic seal between the metal plate and the plastic portion, wherein the interlocking end comprises an out-of-plane region entirely embedded within the plastic portion and an interlock path length that is greater than a thickness of the metal portion;
a sound radiating surface positioned within the encased space and dividing the encased space into a first acoustic chamber and a second acoustic chamber, and wherein the metal plate forms a portion of the first acoustic chamber;
a voice coil extending from one side of the sound radiating surface; and
a magnet assembly having a magnetic gap aligned with the voice coil.

13. The micro speaker assembly of claim 12 wherein the first acoustic chamber is a front volume chamber formed between the sound radiating surface and the metal plate, and the acoustic channel acoustically couples the front volume chamber to the surrounding environment.

14. The micro speaker assembly of claim 12 wherein the metal plate comprises a thickness of 4 millimeters or less.

15. The micro speaker assembly of claim 12 wherein the out-of-plane region extends in a direction toward the sound radiating surface or away from the sound radiating surface.

16. The micro speaker assembly of claim 12 wherein the interlocking end comprises an interlock path length of from 0.8 mm to 1.6 mm.

17. The micro speaker assembly of claim 12 wherein the plastic portion is insert molded to the interlocking end and the plurality of interlocking pores.

18. A method of manufacturing a micro speaker assembly comprising: forming a micro speaker enclosure having an enclosure wall separating a surrounding environment from an encased space, wherein the enclosure wall defines, in part, an acoustic channel that acoustically couples the encased space to the surrounding environment, and the enclosure wall comprises a chemically etched insert molded metal portion that is mechanically interlocked and hermetically sealed to a plastic portion, the chemically etched insert molded metal portion having an interlocking end comprising a planar side that is planar to the metal portion and an out-of-plane side that is outside of the plane of the metal portion and at a right angle to the planar side, and the planar side and the out-of-plane side are entirely embedded within the plastic portion; and positioning a speaker assembly within the encased space, the speaker assembly having a sound radiating surface facing the chemically etched insert molded metal portion of the enclosure wall, a voice coil extending from the sound radiating surface, a magnet assembly having a magnetic gap aligned with the voice coil, and an acoustic chamber formed, in part, by the chemically etched insert molded metal portion of the enclosure wall and the sound radiating surface.

19. The method of claim 18 wherein the chemically etched insert molded metal portion is formed using a nano molding technology to form the plurality of interlocking pores.

20. The method of claim 18 wherein the chemically etched insert molded metal portion that is mechanically interlocked and hermetically sealed to the plastic portion forms a portion of a front volume chamber acoustically coupling the sound radiating surface to the acoustic channel of the micro speaker enclosure.

* * * * *